(12) United States Patent
Ogawa

(10) Patent No.: US 8,994,124 B2
(45) Date of Patent: Mar. 31, 2015

(54) SEMICONDUCTOR DEVICE, METHOD OF MANUFACTURING SEMICONDUCTOR DEVICE AND SYSTEM OF PROCESSING SUBSTRATE

(75) Inventor: Arito Ogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 146 days.

(21) Appl. No.: 13/425,437

(22) Filed: Mar. 21, 2012

(65) Prior Publication Data

US 2012/0261773 A1 Oct. 18, 2012

(30) Foreign Application Priority Data

Apr. 15, 2011 (JP) .................................. 2011-091248
Feb. 29, 2012 (JP) .................................. 2012-043872

(51) Int. Cl.
*H01L 29/78* (2006.01)
*H01L 21/02* (2006.01)
*H01L 21/28* (2006.01)
*H01L 29/49* (2006.01)
*H01L 29/51* (2006.01)

(52) U.S. Cl.
CPC .... *H01L 21/02164* (2013.01); *H01L 21/28088* (2013.01); *H01L 21/28176* (2013.01); *H01L 21/28194* (2013.01); *H01L 21/02181* (2013.01); *H01L 21/022* (2013.01); *H01L 21/02238* (2013.01); *H01L 21/0228* (2013.01); *H01L 29/4966* (2013.01); *H01L 29/513* (2013.01); *H01L 29/517* (2013.01)
USPC .............. 257/412; 257/E21.409; 257/29.255; 438/591; 118/719

(58) Field of Classification Search
USPC ........................................................ 257/411
See application file for complete search history.

(56) References Cited

U.S. PATENT DOCUMENTS

2002/0195683 A1 12/2002 Kim et al.
2004/0020601 A1 2/2004 Zhao et al.
(Continued)

FOREIGN PATENT DOCUMENTS

JP 2007-184594 A 7/2007
KR 10-0843223 7/2008
(Continued)

OTHER PUBLICATIONS

English language translation of the following: Office action dated Apr. 29, 2013 from the KPO in a Korean patent application corresponding to the instant patent application. This office action translation i submitted now in order to supplement the understanding of patent document KR 10-0843223 and WO 2011-013374 which are cited in the office action and are being disclosed in the instant Information Disclosure Statement.

(Continued)

*Primary Examiner* — David Vu
*Assistant Examiner* — Jonathan Han
(74) *Attorney, Agent, or Firm* — Solaris Intellectual Property Group, PLLC

(57) ABSTRACT

Disclosed is a semiconductor device that comprises a gate insulating film formed on a semiconductor substrate; a first conductive metal-containing film formed on the gate insulating film; a second conductive metal-containing film, formed on the first metal-containing film, to which aluminum is added; and a silicon film formed on the second metal-containing film.

20 Claims, 14 Drawing Sheets

(56) References Cited

U.S. PATENT DOCUMENTS

| | | |
|---|---|---|
| 2005/0098839 A1 | 5/2005 | Lee et al. |
| 2007/0023842 A1 | 2/2007 | Jung et al. |
| 2007/0152283 A1 | 7/2007 | Baik et al. |
| 2007/0176242 A1 | 8/2007 | Lee et al. |
| 2008/0067606 A1 | 3/2008 | Jung et al. |
| 2009/0308636 A1* | 12/2009 | Chudzik et al. ............ 174/126.4 |
| 2010/0133604 A1* | 6/2010 | Kim et al. .................. 257/324 |
| 2010/0206841 A2* | 8/2010 | Ko et al. ..................... 216/37 |
| 2010/0237444 A1 | 9/2010 | Lin |
| 2011/0193181 A1 | 8/2011 | Jung et al. |
| 2012/0112282 A1 | 5/2012 | Lin |
| 2012/0199919 A1 | 8/2012 | Nakagawa et al. |

FOREIGN PATENT DOCUMENTS

| | | |
|---|---|---|
| TW | 436907 | 5/2001 |
| TW | 490765 | 6/2002 |
| TW | 201036063 | 10/2010 |
| WO | 2011-013374 | 2/2011 |

OTHER PUBLICATIONS

"A Highly Manufacturable MIPS (Metal Inserted Poly-Si Stack) Technology with Novel Threshold Voltage Control" 2005 Symposium on VLSI Technology Digest of Technical Papers pp. 232-233.
English language translation of the following: Office action dated Apr. 11, 2014 from the TIPO in a Taiwanese patent application corresponding to the instant patent application. This office action translation is submitted now in order to supplement the understanding of patent document TW201036063, TW436907 and TW490765 which are cited in the office action and are being disclosed in the instant Information Disclosure Statement.

* cited by examiner

FIG.9

|  | TREATMENT AT 1,000°C | EOT (nm) | Vfb (V) |
|---|---|---|---|
| COMPARATIVE EXAMPLE | NONE | 3.96 | 0.45 |
| COMPARATIVE EXAMPLE | DONE | 4.17 | 0.43 |
| EMBODIMENT | NONE | 4.13 | 0.43 |
| EMBODIMENT | DONE | 3.87 | 0.48 |

US 8,994,124 B2

SEMICONDUCTOR DEVICE, METHOD OF MANUFACTURING SEMICONDUCTOR DEVICE AND SYSTEM OF PROCESSING SUBSTRATE

CROSS-REFERENCE TO RELATED APPLICATION

This application claims priority under 35 USC 119 from Japanese Patent Application No. 2011-91248 filed on Apr. 15, 2011 and Japanese Patent Application No. 2012-43872 filed on Feb. 29, 2012, the disclosures of which are incorporated by reference herein.

BACKGROUND OF THE INVENTION

Related Art

The present invention relates to a semiconductor device, a method of manufacturing a semiconductor device and a system of processing a substrate, and more particularly to a MOSFET (Metal-Oxide-Semiconductor Field Effect Transistor), a method of manufacturing the same and a system of processing a substrate.

The reduction in a thickness (EOT (Effective Oxide Thickness) scaling) of a gate insulating film has been performed in accordance with a high integration and a high performance of a MOSFET. Hitherto, a $SiO_2$ film has been used as a gate insulating film, but the reduction in the gate insulating film remarkably increases in a gate leakage current. Consequently, in order to reduce the gate leakage current, an insulating film (High-k insulating film) having a higher dielectric constant than that of the $SiO_2$ film is currently beginning to be applied to the gate insulating film. Among other things, an $HfO_2$ film is considered promising. On the other hand, a polycrystalline silicon (Poly-Si) has been hitherto used as a gate electrode material, but use of a polycrystalline silicon electrode causes the formation of a depletion layer, thereby increasing the effective thickness of the gate insulating film by the amount the depletion layer is formed, which results in running counter to the reduction in the thickness of the gate insulating film. Consequently, metal materials in which a depletion layer is not generated are being examined for use for the gate electrode.

In recent years, in a MOSFET stack structure in which such a metal gate electrode and a High-k gate insulating film are used, using a gate electrode having a MIPS (Metal Inserted Poly Silicon) structure in which the metal gate electrode is inserted between a gate insulating film and a polycrystalline silicon gate electrode, a gate first process has attracted attention in which activation annealing of source/drain regions is performed after the formation of the gate electrode (see "A Highly Manufacturable MIPS (Metal Inserted Poly-Si Stack) Technology with Novel Threshold Voltage Control" 2005 Symposium on VLSI Technology Digest of Technical Papers pp. 232-233).

However, in the MIPS structure, there has been a problem that Si in polycrystalline silicon passes through a metal film during activation annealing of the source/drain regions and reaches the interface between the metal electrode and the High-k gate insulating film, causing a phenomenon called Fermi-level pinning, and thus a threshold voltage rises (flat band voltage drops).

SUMMARY OF THE INVENTION

A main object of the present invention is to provide a semiconductor device which is capable of preventing or suppressing a rise in a threshold voltage, and preventing or suppressing a drop in flat band voltage, a method of manufacturing such a semiconductor device, and a system of processing a substrate suitably used in the manufacturing of such a semiconductor device.

According to a first aspect of the present invention, there is provided a semiconductor device, comprising: a gate insulating film formed on a semiconductor substrate; a first conductive metal-containing film formed on the gate insulating film; a second conductive metal-containing film, formed on the first metal-containing film, to which aluminum is added; and a silicon film formed on the second metal-containing film.

According to a second aspect of the present invention, there is provided a method of manufacturing a semiconductor device, comprising: forming a gate insulating film on a semiconductor substrate; forming a first conductive metal-containing film on the gate insulating film; forming a second conductive metal-containing film to which aluminum is added onto the first metal-containing film; and forming a silicon film on the second metal-containing film.

According to a second aspect of the present invention, there is provided a system of processing a substrate, comprising: a first processing unit that forms a gate insulating film on a semiconductor substrate; a second processing unit that forms a first conductive metal-containing film on the gate insulating film; a third processing unit that forms a second conductive metal-containing film to which aluminum is added, on the first metal-containing film; and a fourth processing unit that forms a silicon film on the second metal-containing film.

BRIEF DESCRIPTION OF THE DRAWINGS

An exemplary embodiment of the present invention will be described in detail based on the following figures, wherein:

FIG. 9 is a table illustrating EOT (effective oxide thickness) and Vfb (flat band voltage) of the evaluation sample for a MOSFET according to a preferred embodiment of the invention and the evaluation sample for a MOSFET according to the comparative example;

DETAILED DESCRIPTION

Hereinafter, preferred embodiments of the present invention will be described with reference to the drawings.

Figure 1:
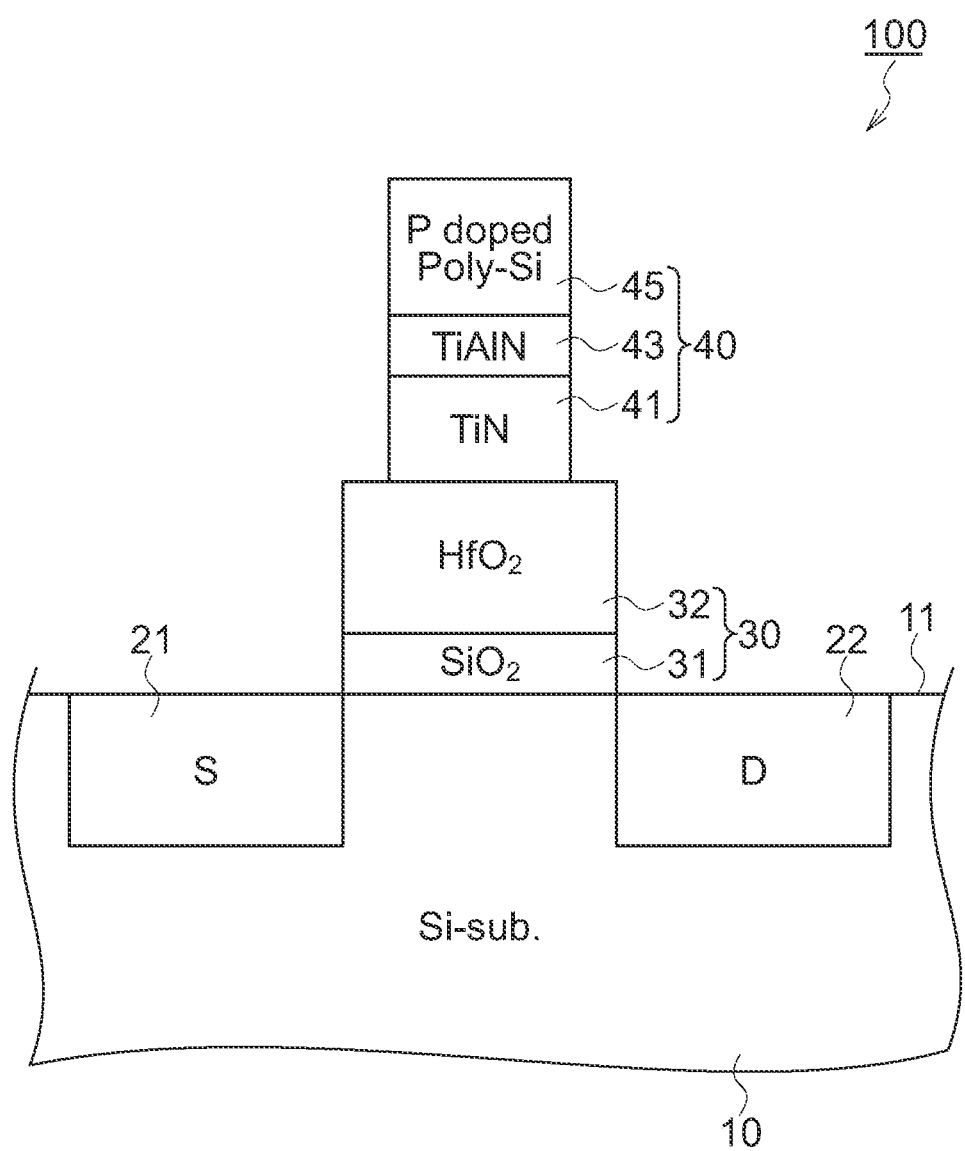
FIG. 1 is a schematic longitudinal cross-sectional view for explaining a MOSFET according to a preferred embodiment of the present invention.

Referring to FIG. 1, a MOSFET 100 as a semiconductor device according to a preferred embodiment of the present invention includes a silicon substrate 10 which is a semiconductor substrate, a gate insulating film 30 provided on one principal surface 11 of the silicon substrate 10, a gate electrode 40 provided on the gate insulating film 30, and a source region 21 and a drain region 22 provided in the one principal surface 11 of the silicon substrate 10 and located on both sides of the gate electrode 40.

The gate insulating film 30 includes a $SiO_2$ film 31 provided on the one principal surface 11 of the silicon substrate 10 and a $HfO_2$ film 32, which is a high dielectric constant (High-k) insulating film, provided on the $SiO_2$ film 31. A gate leakage current is reduced by using the $HfO_2$ film 32 which is a high dielectric constant insulating film.

The gate electrode 40 includes a TiN film 41 provided on the $HfO_2$ film 32 of the gate insulating film 30, a TiAlN film 43 provided on the TiN film 41, and a polycrystalline silicon film 45 doped with P (P doped poly-Si film) provided on the TiAlN film 43. Since the TiN film 41 which is a metal film is used on the $HfO_2$ film 32, a depletion layer is not generated, and thus the effective thickness of a gate insulating film is prevented from increasing. In addition, the TiAlN film 43 is provided between the polycrystalline silicon film 45 and the TiN film 41, and thus when activation annealing of the source region 21 and the drain region 22 is performed after the formation of the gate electrode 40, it is possible to prevent Si in the polycrystalline silicon film 45 from being diffused into the TiN film 41 which is a metal film. As a result, it is possible to prevent Si in the polycrystalline silicon film 45 from reaching the interface between the TiN film 41 and the $HfO_2$ film 32 which is a high dielectric constant gate insulating film by passing through the TiN film 41, to prevent or suppress a rise in a threshold voltage, and to prevent or suppress a drop in flat band voltage.

Figure 2:
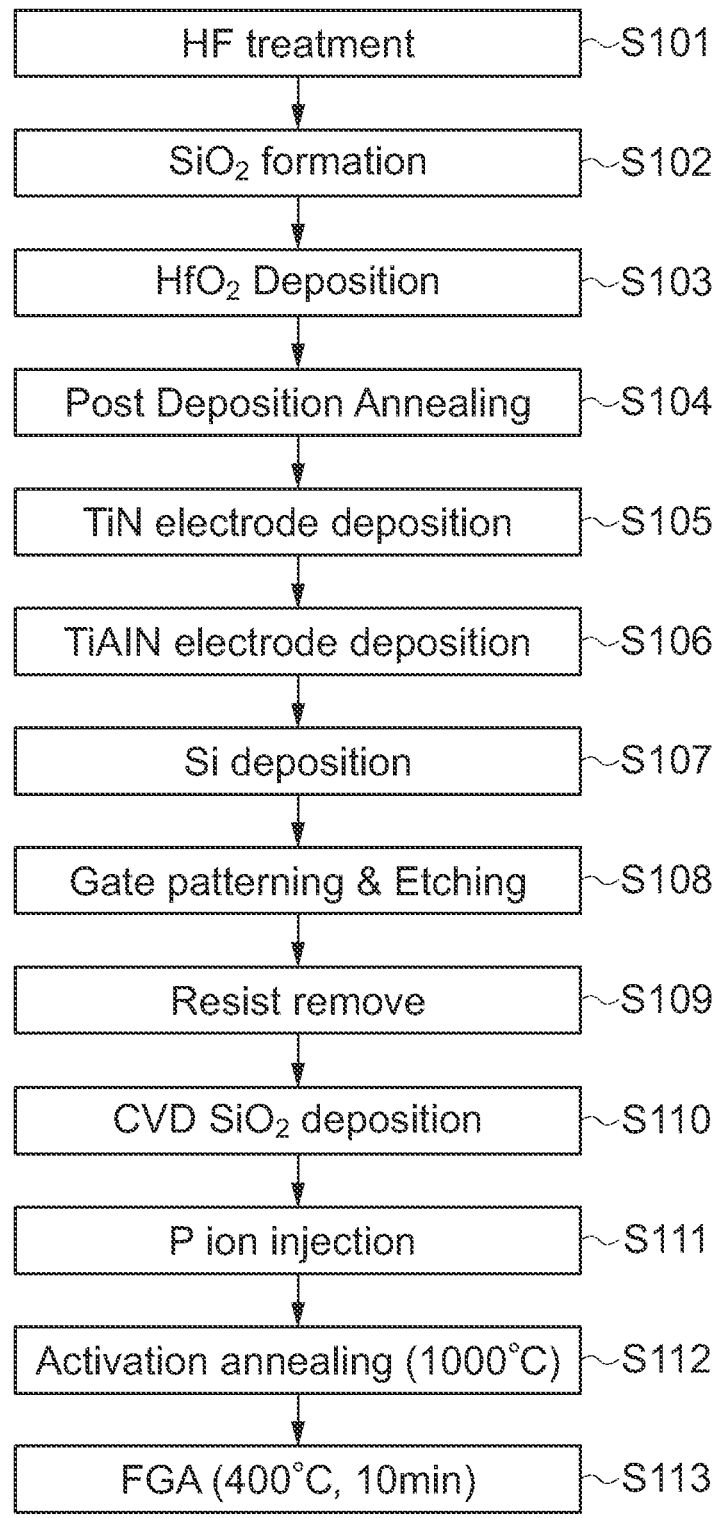
FIG. 2 is a flowchart for explaining a method of manufacturing a MOSFET according to a preferred embodiment of the present invention.

Next, a method of manufacturing a MOSFET according to a preferred embodiment of the invention will be described with reference to FIG. 2.

First, the silicon substrate 10 is treated using, for example, an aqueous HF solution of 1%, and a sacrificial oxide film on the one principal surface 11 of the silicon substrate 10 is removed (step S101).

Next, the silicon oxide film ($SiO_2$ film) 31 used as a silicon-based insulating film is formed on the one principal surface 11 of the silicon substrate 10 by thermal oxidation (step S102). The $SiO_2$ film 31 is formed as an interface layer at the interface between the silicon substrate 10 and the $HfO_2$ film 32 which is a high dielectric constant insulating film formed thereafter. The $SiO_2$ film 31 constitutes a portion of the gate insulating film 30.

Specifically, for example, using an oxidation furnace, the silicon substrate 10 is accommodated in a processing chamber of the oxidation furnace, and an oxidizing gas such as an $O_2$ gas is supplied into the processing chamber, whereby the $SiO_2$ film 31 is formed as an interface layer on the one principal surface 11 of the silicon substrate 10 by thermal oxidation (dry oxidation). The processing conditions are, for example, as follows.

Temperature of the silicon substrate 10: 850 to 1,000° C.
Pressure in the processing chamber: 1 to 1,000 Pa
$O_2$ gas supply flow rate: 10 to 1,000 sccm
Thickness of the $SiO_2$ film 31: 0.4 to 1.5 nm Meanwhile, in place of the dry oxidation, the $SiO_2$ film 31 may be formed using wet oxidation, decompression oxidation, plasma oxidation, or the like.

Next, the hafnium oxide film ($HfO_2$ film) 32 is deposited on the $SiO_2$ film 31 as a high dielectric constant insulating film (High-k film) (step S103). The $HfO_2$ film 32 is formed as the gate insulating film 30.

Specifically, for example, using an ALD (Atomic layer Deposition) furnace, the silicon substrate 10 after the formation of the $SiO_2$ film 31 is accommodated in a processing chamber of the ALD furnace, and the $HfO_2$ film 32 is formed as a gate insulating film on the $SiO_2$ film 31 by an alternate supply of a TDMAH gas and an $O_3$ gas into this processing chamber (one cycle of TDMAH gas supply→$N_2$ purge→$O_3$ gas supply→$N_2$ purge is repeated a predetermined number of times). The processing conditions are, for example, as follows.

Temperature of the silicon substrate 10: 100 to 400° C.
Pressure in the processing chamber: 1 to 2000 Pa
TDMAH gas supply flow rate: 10 to 2000 sccm
$O_3$ gas supply flow rate: 10 to 2000 sccm
$N_2$ gas supply flow rate: 10 to 10,000 sccm
Thickness of the $HfO_2$ film 32: 0.9 to 4 nm As sources containing Hf, organic sources such as tetrakis (ethyl-methyl-amino)hafnium ($Hf[N(C_2H_5)(CH_3)]_4$, abbrev.: TEMAH) and tetrakis(diethylamino)hafnium ($Hf[N(C_2H_5)_2]_4$, abbrev.: TDEAH), or inorganic sources such as hafnium tetrachloride ($HfCl_4$) can be used in place of tetrakis (dimethylamino)hafnium ($Hf[N(CH_3)_2]_4$, abbrev.: TDMAH). As oxidizing agents, an oxidizing gas (oxygen-containing gas) such as an $H_2O$ gas can be used in place of an $O_3$ gas. As purge gases (inert gases), rare gases such as Ar, He, Ne, and Xe can be used in place of a $N_2$ gas. Meanwhile, when liquid sources, such as TDMAH, which are in a liquid state under ordinary temperature and ordinary pressure are used, the liquid sources are vaporized by a vaporization system such as a vaporizer and a bubbler, and are supplied as a source gas.

After the $HfO_2$ film 32 is deposited, PDA (Post Deposition Annealing) is performed (step S104). Specifically, for example, using a heat-treating furnace (for example, RTP (Rapid Thermal Process) apparatus), the silicon substrate 10 after the formation of the $HfO_2$ film 32 is accommodated in a processing chamber of the RTP device, and annealing is performed by supplying a $N_2$ gas into this processing chamber. The PDA is performed for the purpose of removal of impurities in the $HfO_2$ film 32, and densification or crystallization of the $HfO_2$ film 32. The processing conditions are, for example, as follows.

Temperature of the silicon substrate 10: 400 to 800° C.
Pressure in the processing chamber: 1 to 1,000 Pa N₂ gas supply flow rate: 10 to 10,000 sccm
Annealing time: 10 to 60 seconds Next, the titanium nitride film (TiN film) 41 is formed on the HfO₂ film 32 after the PDA as a first metal film, that is, a first conductive metal-containing film (step S105). The TiN film 41 constitutes a portion of the gate electrode 40.

Specifically, for example, using the ALD furnace, the silicon substrate 10 after the PDA is accommodated in the processing chamber of the ALD furnace, and the TiN film 41 is formed on the HfO₂ film 32 after the PDA by an alternate supply of a TiCl₄ gas and an NH₃ gas into this processing chamber (one cycle of TiCl₄ gas supply→N₂ purge→NH₃ gas supply→N₂ purge is repeated a predetermined number of times). The processing conditions are, for example, as follows.

Temperature of the silicon substrate 10: 300 to 450° C.
Pressure in the processing chamber: 1 to 10,000 Pa
TiCl₄ gas supply flow rate: 10 to 10,000 sccm
NH₃ gas supply flow rate: 10 to 50,000 sccm
N₂ gas supply flow rate: 10 to 10,000 sccm
Thickness of the TiN film 41: 5 to 20 nm As sources containing Ti, organic sources such as tetrakis (ethyl-methyl-amino)titanium (Ti[N(C₂H₅)(CH₃)]₄, abbrev.: TEMAT), tetrakis(dimethylamino)titanium (Ti[N(CH₃)₂]₄, abbrev.: TDMAT), and tetrakis(diethylamino)titanium (Ti[N(C₂H₅)₂]₄, abbrev.: TDEAT) can be used in place of titanium tetrachloride (TiCl₄) which is an inorganic source. As nitriding agents, nitriding gases (nitrogen-containing gases) such as diazine (N₂H₂) gas, a hydrazine (N₂H₄) gas, and an N₃H₈ gas can be used in place of an ammonia (NH₃) gas. As purge gases (inert gases), rare gases such as Ar, He, Ne, and Xe can be used in place of a N₂ gas. Meanwhile, when liquid sources, such as TiCl₄, which are in a liquid state under ordinary temperature and ordinary pressure are used, the liquid sources are vaporized by a vaporization system such as a vaporizer and a bubbler, and are supplied as a source gas.

Next, the titanium aluminum nitride film (TiAlN film) 43 is formed on the TiN film 41 as a second metal film, that is, a second conductive metal-containing film (step S106). The TiAlN film 43 is a conductive metal-containing film obtained by adding aluminum (Al) to the same material as the TiN film 41 and constituted of the same material as the TiN film 41 to which aluminum is added, and functions as a diffusion barrier film for preventing silicon (Si) from being diffused from the polycrystalline silicon film 45 formed thereafter to the interface between the TiN film 41 and the HfO₂ film 32, that is, a Si diffusion block layer. It is possible to prevent Si in the polycrystalline silicon film 45 from reaching the interface between the TiN film 41 and the HfO₂ film 32 by passing through the TiN film 41, using this TiAlN film 43. As shown in FIG. 1, the TiAlN film 43 is formed at the interface between the polycrystalline silicon film 45 and the TiN film 41.

The TiAlN film 43 constitutes a portion of the gate electrode 40 together with the TiN film 41. Meanwhile, the TiN film 41 and the TiAlN film 43 may be separately formed in different film-forming apparatuses, that is, different processing chambers. However, since both films can be formed under the similar conditions, it is preferable that the both films are continuously formed in-situ in the same processing chamber.

Specifically, for example, using the ALD furnace, the silicon substrate 10 after the formation of the TiN film 41 is accommodated in the processing chamber of the ALD furnace, and the TiAlN film 43 in which TiN and AlN are alternately laminated is formed on the TiN film 41 by an alternate supply of a TiCl₄ gas, a TMA gas and an NH₃ gas into this processing chamber (one cycle of TiCl₄ gas supply→N₂ purge→NH₃ gas supply→N₂ purge is performed a predetermined number of times (m times) to form TiN and then, one cycle of TMA gas supply→N₂ purge→NH₃ gas supply→N₂ purge is performed one time to form AlN, and one cycle of the formation of TiN and the formation of AlN is performed a predetermined number of times (n times)). Meanwhile, the TiN film 41 and the TiAlN film 43 are continuously formed in-situ within the same processing chamber. The processing conditions are, for example as follows.

Temperature of the silicon substrate 10: 300 to 450° C.
Pressure in the processing chamber: 1 to 10,000 Pa
TiCl₄ gas supply flow rate: 10 to 10,000 sccm
TMA gas supply flow rate: 10 to 10,000 sccm
NH₃ gas supply flow rate: 10 to 50,000 sccm
N₂ gas supply flow rate: 10 to 10,000 sccm
Thickness of the TiAlN film 43: 3 to 20 nm, preferably, 5 to 10 nm When the thickness of the TiAlN film 43 is reduced to less than 3 nm, a block effect of the Si diffusion deteriorates, and thus the Si diffusion may not be capable of being sufficiently suppressed. When the thickness of the TiAlN film 43 is set to be equal to or more than 3 nm, the block effect of the sufficient Si diffusion is obtained, and thus the Si diffusion is capable of being sufficiently suppressed. When the thickness of the TiAlN film 43 is set to be equal to or more than 5 nm, the Si diffusion is capable of being more sufficiently suppressed. On the other hand, when the thickness of the TiAlN film 43 is set to be more than 20 nm, because the resistivity of TiAlN is larger than the resistivity of TiN, the resistivity in the entirety of the gate electrode 40 may rise more than necessary. This can be prevented by setting the thickness of the TiAlN film 43 to be equal to or less than 20 nm. Particularly, the thickness of the TiAlN film 43 is set to be equal to or less than 10 nm, whereby it is possible to further suppress a rise in the resistivity in the entirety of the gate electrode 40, and to set the resistivity to a more appropriate value. Consequently, it is preferable that the thickness of the TiAlN film 43 is set to preferably 3 to 20 nm, and more preferably 5 to 10 nm. In addition, when the Al concentration of the TiAlN film 43 is set to be less than 10%, the Al concentration becomes excessively low and the block effect of the Si diffusion deteriorates, and thus the Si diffusion may not be capable of being sufficiently suppressed. When the Al concentration of the TiAlN film 43 is equal to be equal to or more than 10%, the block effect of the sufficient Si diffusion is obtained, and thus the Si diffusion is capable of being sufficiently suppressed. On the other hand, when the Al concentration of the TiAlN film 43 is set to be more than 20%, the insulation properties of the TiAlN film 43 are strengthened and the resistivity increases, and thus the resistivity in the entirety of the gate electrode 40 may increase more than necessary. This can be prevented by setting the Al concentration of the TiAlN film 43 to be equal to or less than 20%. Consequently, it is preferable that the Al concentration of the TiAlN film 43 is set to preferably 10 to 20%.

Meanwhile, as sources containing Ti, nitriding agents, and purge gases (inert gases), it is possible to use the same things as those in the deposition step of the TiN film 41 (step S105). As sources containing Al, inorganic sources such as trichloroaluminum (AlCl₃) can be used in place of trimethylaluminum (Al(CH₃)₃, abbrev.: TMA) which is an organic source. Meanwhile, when liquid sources, such as TMA, which are in a liquid state under ordinary temperature and ordinary pressure are used, the liquid sources are vaporized by a vaporization system such as a vaporizer and a bubbler, and are supplied as a source gas.

Figure 3:
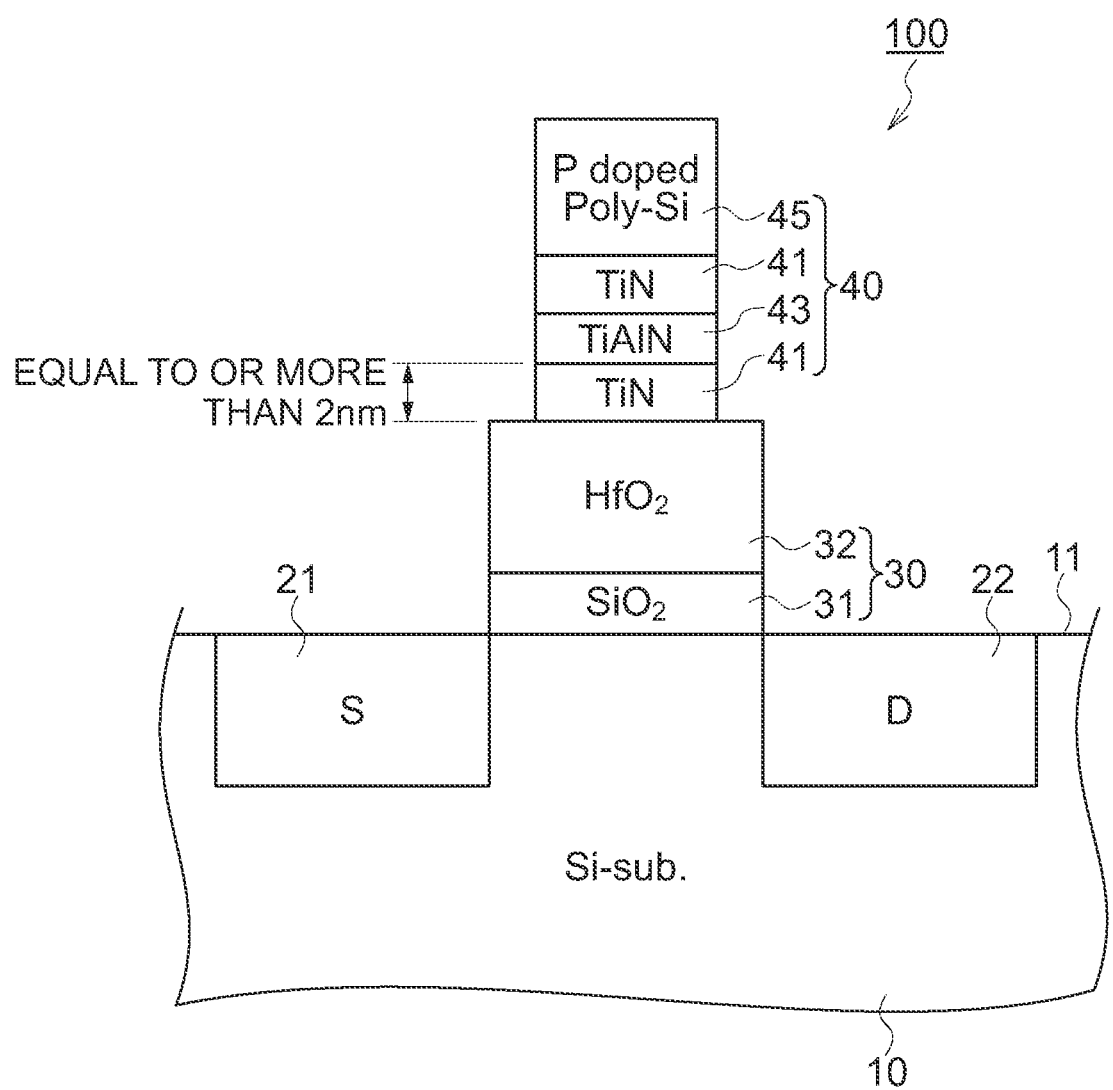
FIG. 3 is a schematic longitudinal cross-sectional view for explaining a MOSFET according to a preferred embodiment of the present invention.

Meanwhile, as shown in FIG. 3, the TiAlN film 43 may be formed in the TiN film 41, that is, between the upper TiN film 41 and the lower TiN film 41. However, in this case, as shown in FIG. 3, the TiAlN film 43 is preferably separated at a distance of equal to or more than 2 nm from the HfO$_2$ film 32. When the distance between the TiAlN film 43 and the HfO$_2$ film 32 is set to be less than 2 nm, for example, 1 nm, a work function of the TiAlN film 43 may affect the Vfb (flat band voltage). When the TiAlN film 43 is separated at a distance of equal to or more than 2 nm from the HfO$_2$ film 32, the influence thereof is eliminated.

Next, the polycrystalline silicon film 45, that is, the polysilicon film (poly-Si film) 45 is formed on the TiAlN film 43 (step S107). The poly-Si film 45 is doped with phosphorus (P) or boron (B) as an impurity (dopant) in an ion implantation step described later, and the poly-Si film 45 becomes a phosphorus doped polycrystalline silicon film (P doped poly-Si film) or a boron doped polycrystalline silicon film (B doped poly-Si film). In the present embodiment, a phosphorus doped polycrystalline silicon film (P doped poly-Si film) is formed. The poly-Si film 45 constitutes a portion of the gate electrode 40 together with the TiAlN film 43 and the TiN film 41.

Specifically, for example, using a CVD furnace, the silicon substrate 10 after the formation of the TiAlN film 43 is accommodated in a processing chamber of the CVD furnace, and the poly-Si film 45 is formed on the TiAlN film 43 by a continuous supply of a monosilane (SiH$_4$) gas into this processing chamber. As silicon source gases, silane-based gases such as a disilane (Si$_2$H$_6$) gas and a dichlorosilane (SiH$_2$Cl$_2$) gas may be used in place of a SiH$_4$ gas. At this time, an inert gas such as a N$_2$ gas may be simultaneously supplied as a dilution gas. The processing conditions are, for example as follows.

Temperature of the silicon substrate 10: 600 to 700° C.
Pressure in the processing chamber: 10 to 48,000 Pa
SiH$_4$ gas supply flow rate: 10 to 20,000 sccm
N$_2$ gas supply flow rate: 10 to 10,000 sccm
Thickness of the poly-Si film 45: 50 to 200 nm Thereafter, using a resist (not shown) selectively formed on the gate electrode 40 as a mask, patterning of the gate electrode 40 using a photolithography technique and pattern etching thereof using a dry etching technique are performed (step S108). Thereafter, the resist (not shown) is removed (step S109). In this manner, after the gate electrode 40 is processed, the gate insulating film 30 is also simultaneously processed, and the one principal surface 11 of the silicon substrate 10 is exposed. Meanwhile, the processing of the gate insulating film 30 may be separately performed by wet etching.

Next, a SiO$_2$ film (not shown) is formed on the poly-Si film 45 (step S110). Specifically, for example, using the CVD furnace, the silicon substrate 10 after the patterning, the etching and the resist removal is accommodated in the processing chamber of the CVD furnace, and the SiO$_2$ film is formed on the poly-Si film 45 by supplying a TEOS gas into this processing chamber. The SiO$_2$ film is formed as a cap film for preventing outward diffusion of phosphorus (P) implanted into the poly-Si film 45 from the poly-Si film 45 in the next ion implantation step. In addition, the SiO$_2$ film is also formed on the one principal surface 11 of the silicon substrate 10 in which the source region 21 and the drain region 22 are formed, and also functions as a channeling preventing film or the like when the ion implantation into the source region 21 and the drain region 22 is performed. The thickness of the SiO$_2$ film is set to, for example, 5 to 20 nm, depending on the thickness of the poly-Si film 45 and the implantation energy in the ion implantation step.

Next, an impurity (dopant) is implanted into the source region 21, the drain region 22 or the poly-Si film 45 through the SiO$_2$ film by an ion implantation method in an ion implantation apparatus (step S111). In the present embodiment, phosphorus (P) is implanted into the poly-Si film 45. Thereby, the poly-Si film 45 becomes a phosphorus doped polycrystalline silicon film (P doped poly-Si film). In addition, phosphorus (P) or boron (B) is implanted into the source region 21 or the drain region 22. For example, when phosphorus is implanted, a solid source of phosphorus is used. The ion implantation is performed multiple times depending on the impurity concentration distribution or the like of the source region 21 and the drain region 22 and the impurity concentration or the like in the poly-Si film 45. The injection energy at the time of the ion implantation of phosphorus is set to, for example, 30 keV. Meanwhile, in the step of forming the polycrystalline silicon film (poly-Si film) 45 (step S107), the P doped poly-Si film 45 can also be formed in the CVD furnace, using a SiH$_4$ gas and PH$_3$.

Next, activation annealing of the source region 21, the drain region 22 and the P doped poly-Si film 45 is performed (step S112). Specifically, for example, using a heat-treating furnace (annealing apparatus), the silicon substrate 10 after the ion implantation is accommodated in a processing chamber of the annealing apparatus, and activation annealing is performed at a temperature of 1,000° C. by supplying a N$_2$ gas into this processing chamber. The processing conditions are, for example as follows.

Temperature of the silicon substrate 10: range of 950 to 1050° C., for example, 1,000° C.
Pressure in the processing chamber: 1 to 1,000 Pa (meanwhile, since heating is a purpose, the pressure may be atmospheric pressure)
N$_2$ gas supply flow rate: 10 to 10,000 sccm
Annealing time: 0.05 seconds (50 msec) to 20 seconds Meanwhile, in the embodiment, since the TiAlN film 43 is formed between the polycrystalline silicon film 45 and the TiN film 41, at the time of the activation annealing, Si in the polycrystalline silicon film 45 can be prevented from reaching the interface between the TiN film 41 and the HfO$_2$ film 32 by passing through the TiN film 41. That is, the TiAlN film 43 in the present embodiment functions as a Si diffusion block layer (Si diffusion barrier layer) for blocking the Si diffusion.

Thereafter, an FGA (Forming Gas Annealing) process such as hydrogen gas annealing is performed at a temperature of 400° C. for 10 minutes (step S113). In this manner, a MOS structure having a MIPS structure is formed.

Figure 11:
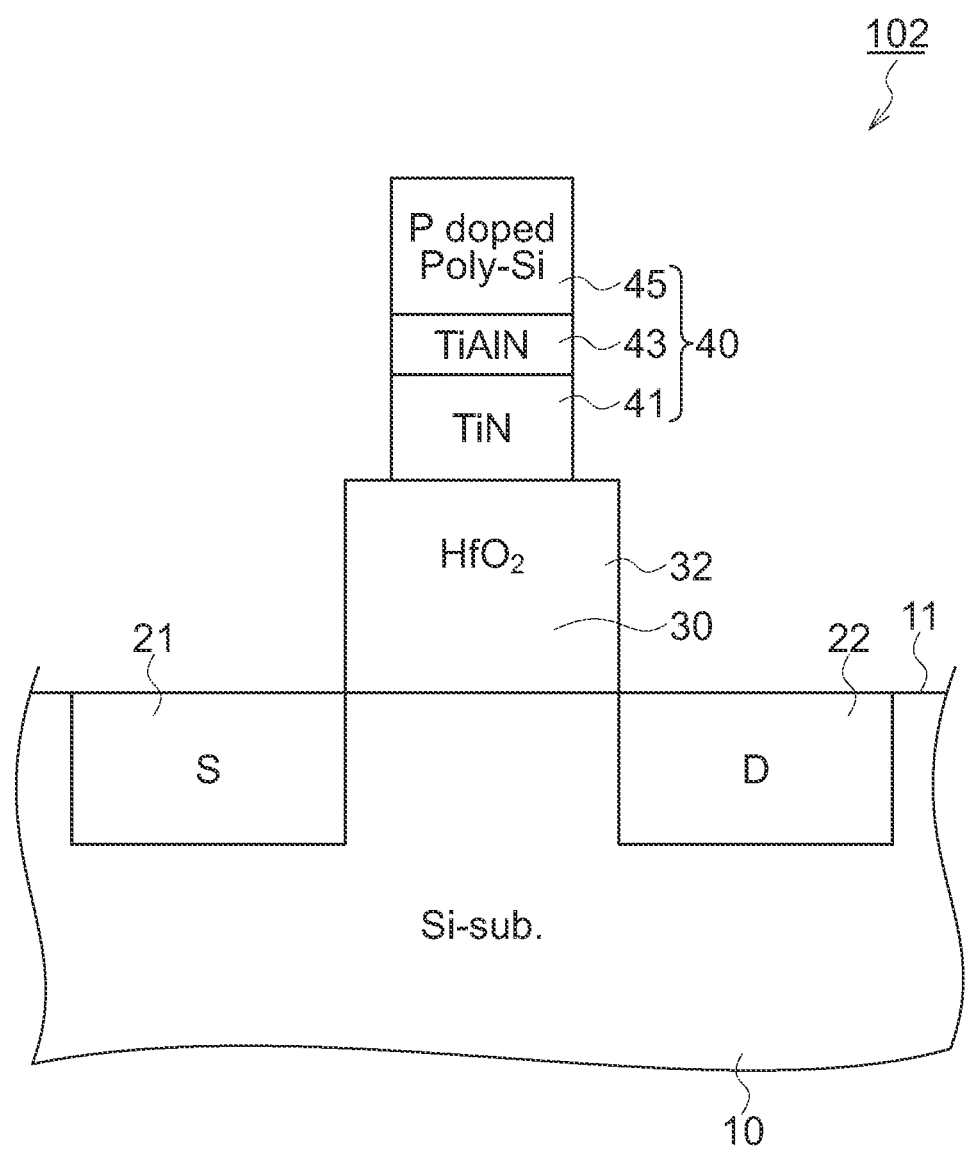
FIG. 11 is a schematic longitudinal cross-sectional view for explaining a MOSFET according to another preferred embodiment of the present invention.

Next, another preferred embodiment of the present invention will be described with reference to FIG. 11. In the MOSFET 100 according to the preferred one embodiment described above, the gate insulating film 30 includes the SiO$_2$ film 31 provided on the one principal surface 11 of the silicon substrate 10 and the HfO$_2$ film 32 which is a high dielectric constant insulating film provided on the SiO$_2$ film 31. However, in a MOSFET 102 according to the another preferred embodiment of the present invention, the gate insulating film 30 includes the HfO$_2$ film 32 only which is a high dielectric constant insulating film provided on the one principal surface 11 of the silicon substrate 10, and does not include the SiO$_2$ film 31, which is a point where the MOSFET 102 is different from the MOSFET 100 of the one embodiment, but other points are the same as each other.

Even in the present another embodiment, a gate leakage current is reduced by using the HfO$_2$ film 32 which is a high dielectric constant insulating film. In addition, the gate electrode 40 includes a TiN film 41 provided on the HfO$_2$ film 32 of the gate insulating film 30, a TiAlN film 43 provided on the TiN film 41, and a polycrystalline silicon film 45 doped with P provided on the TiAlN film 43. Since the TiN film 41 which is a metal film is used on the HfO$_2$ film 32, a depletion layer is not generated, and thus the effective thickness of a gate insulating film is prevented from increasing. In addition, the TiAlN film 43 is provided between the polycrystalline silicon film 45 and the TiN film 41, and thus when activation annealing of the source region 21 and the drain region 22 is performed after the formation of the gate electrode 40, it is possible to prevent Si in the polycrystalline silicon film 45 from being diffused into the TiN film 41 which is a metal film. As a result, it is possible to prevent Si in the polycrystalline silicon film 45 from reaching the interface between the TiN film 41 and the HfO$_2$ film 32 which is a high dielectric constant gate insulating film by passing through the TiN film 41, to prevent or suppress a rise in a threshold voltage, and to prevent or suppress a drop in flat band voltage.

In the above-mentioned preferred embodiments of the present invention, the SiO$_2$ film is used as a silicon-based insulating film serving as an interface layer between the silicon substrate and the HfO$_2$ film which is a high dielectric constant insulating film, but a silicon oxynitride film (SiON film) may be used in place of the SiO$_2$ film. In addition, the HfO$_2$ film is used as a high dielectric constant gate insulating film, but a zirconium oxide film (ZrO$_2$ film), a titanium oxide film (TiO$_2$ film), a niobium oxide film (Nb$_2$O$_5$ film), a tantalum oxide film (Ta$_2$O$_5$ film), a hafnium silicate film (HfSiO$_x$ film), a zirconium silicate film (ZrSiO$_x$ film), a hafnium aluminate film (HfAlO$_x$ film), a zirconium aluminate film (ZrAlO$_x$ film), or a film in which these films are combined or mixed may be used in place of the HfO$_2$ film.

As metal-containing films on the high dielectric constant gate insulating film constituting a portion of the gate electrode, a hafnium nitride film (HfN film), a zirconium nitride film (ZrN), a tantalum nitride film (TaN film), a tungsten film (W film), a tungsten nitride film (WN film) or the like may be used in place of the TiN film.

In addition, as metal-containing films which are used as a Si diffusion barrier film and constitute a portion of the gate electrode, metal films, containing Al and at least one of nitrogen and carbon, such as a TaAlN film, a TaCAlN film, a TiCAlN film, a TaCAl film, a TiCAl film, a HfAlN film, and a ZrAlN film, or films obtained by adding Al to metal films such as a W film, a Ta film, and a Ti film can be used in place of the TiAlN film.

Meanwhile, in the specification, the term "metal film" means a film constituted by conductive substances containing metal atoms, that is, a conductive metal-containing film, and this film also includes a conductive metal nitride film, a conductive metal oxide film, a conductive metal oxynitride film, a conductive metal carbide film (metal carbide film), a conductive metal carbon nitride film, a conductive metal composite film, a conductive metal alloy film, and a conductive metal silicide film, in place of a conductive elemental metal film constituted by an elemental metal. Meanwhile, the TiN film is a conductive metal nitride film, and the TiAlN film is a conductive metal composite film.

At least a portion of steps S102 to S107 in the above-mentioned embodiment may be continuously performed using a cluster device used as a substrate processing system.

For example, steps S102 and S103 may be continuously performed using the cluster device. For example, steps S102 to S104 may be continuously performed using the cluster device. For example, steps S102 to S105 may be continuously performed using the cluster device. For example, steps S102 to S106 may be continuously performed using the cluster device. For example, steps S102 to S107 may be continuously performed using the cluster device.

In addition, for example, steps S103 and S104 may be continuously performed using the cluster device. For example, steps S103 to S105 may be continuously performed using the cluster device. For example, steps S103 to S106 may be continuously performed using the cluster device. For example, steps S103 to S107 may be continuously performed using the cluster device.

In addition, for example, steps S105 and S106 may be continuously performed using the cluster device. For example, steps S105 to S107 may be continuously performed using the cluster device.

Figure 12:
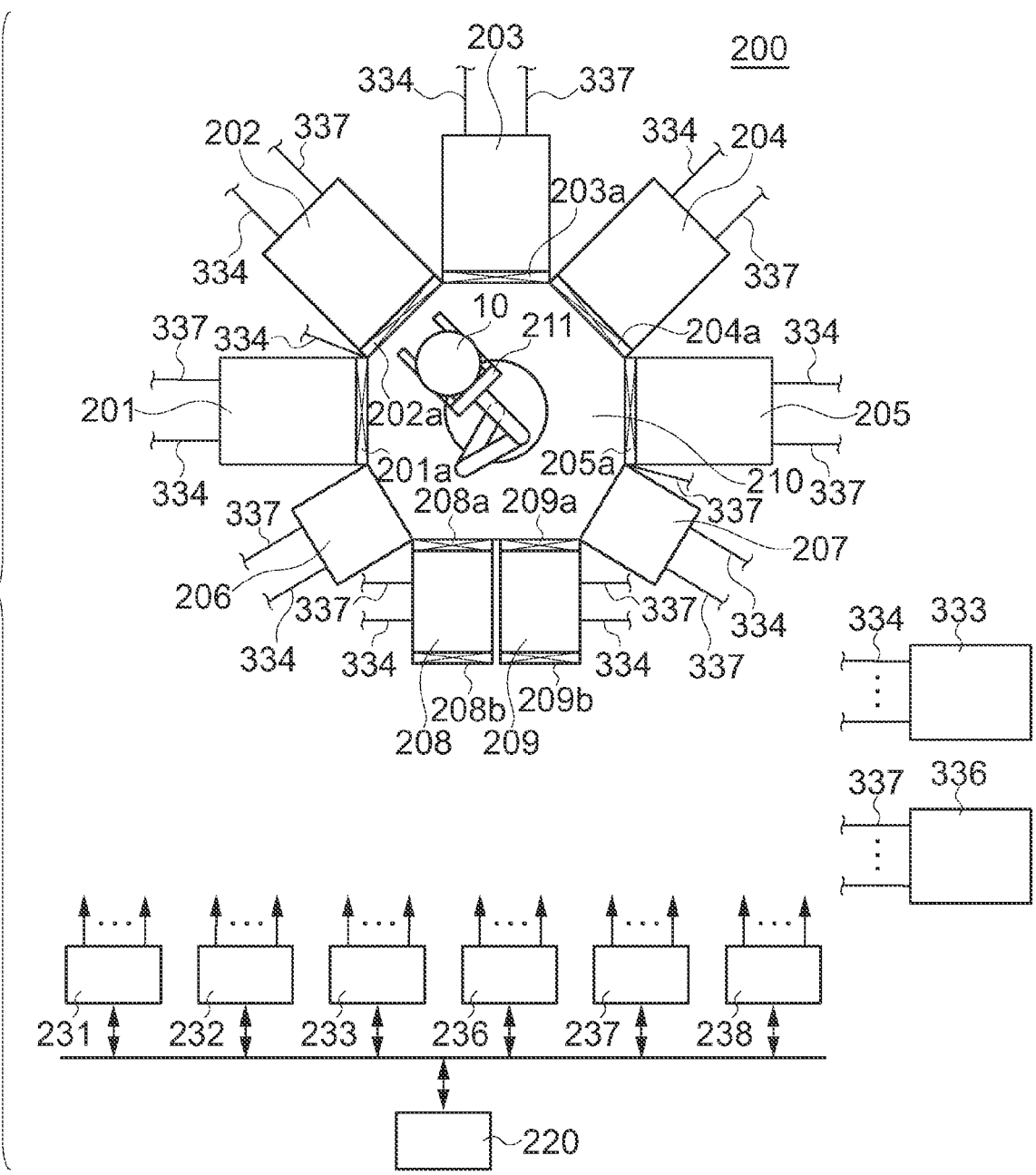
FIG. 12 is a schematic diagram for explaining an example of a cluster apparatus suitably used when a MOSFET according to a preferred embodiment of the present invention is manufactured.

For example, when all of the steps S102 to S107 may be continuously performed using the cluster device, these steps can be performed using a cluster device 200 as shown in FIG. 12.

The cluster device 200 used as a substrate processing system includes processing chambers 201, 202, 203, 204, and 205 used as a processing unit that processes the silicon substrate 10, a loading chamber 208 that loads the silicon substrate 10 into the cluster device 200, an unloading chamber 209 that unloads the silicon substrate 10 from the cluster device 200, cooling chambers 206 and 207 that cool the silicon substrate 10, and a transfer chamber 210 to which the chambers 201, 202, 203, 204, and 205, the loading chamber 208, the unloading chamber 209, and the cooling chambers 206 and 207 are attached, and which is provided with a transfer mechanism 211 that transfers the silicon substrate 10 between these chambers processing. Gate valves 201a, 202a, 203a, 204a, 205a, 208a, and 209a are respectively provided between the transfer chamber 210, and the processing chambers 201, 202, 203, 204, and 205, the loading chamber 208, and the unloading chamber 209. The loading chamber 208 and the unloading chamber 209 are provided with gate valves 208b and 209b, respectively, on the opposite side to the gate valves 208a and 209a.

The cluster device 200 also includes a gas supply system 333 that supplies a processing gas or an inert gas through a gas piping 334 into the processing chambers 201, 202, 203, 204, and 205, and supplies the inert gas through the gas piping 334 into the transfer chamber 210, the loading chamber 208, the unloading chamber 209, and the cooling chambers 206 and 207, and an exhaust system 336 that exhausts the processing chambers 201, 202, 203, 204, and 205, the transfer chamber 210, the loading chamber 208, the unloading chamber 209, and the cooling chambers 206 and 207 through an exhaust pipe 337.

Figure 13:
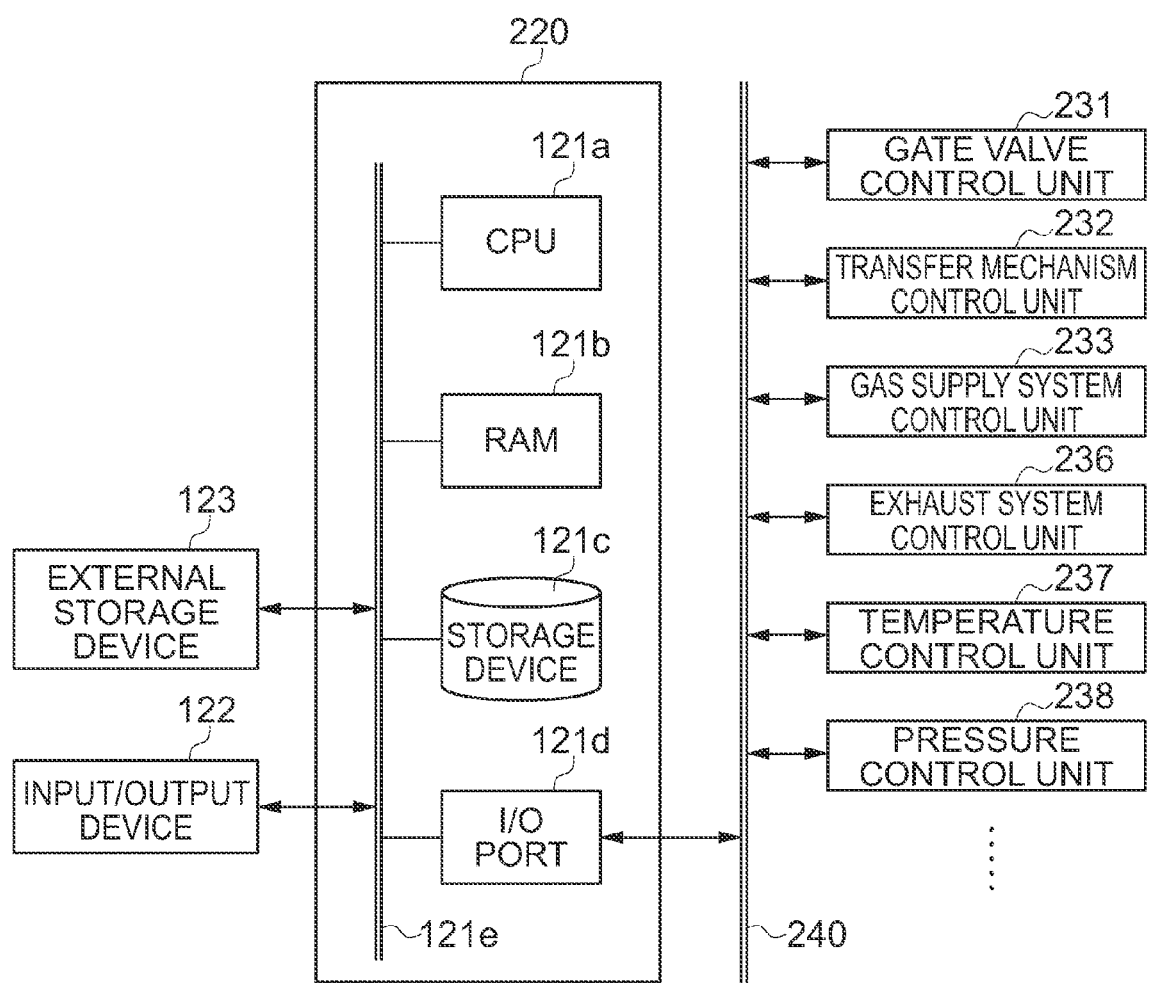
FIG. 13 is a schematic diagram for explaining a controller used in the cluster apparatus of FIGS. 12 and 14.

Referring to FIGS. 12 and 13, the cluster device 200 further includes a gate valve control unit 231 that controls opening and closing operations of the gate valves 201a, 202a, 203a, 204a, 205a, 208a, 209a, 208b, and 209b, a transfer mechanism control unit 232 that controls an operation of the transfer mechanism 211, a gas supply system control unit 233 that controls the gas supply system 333, an exhaust system control unit 236 that controls the exhaust system 336, a temperature control unit 237 that controls temperatures within the processing chambers 201, 202, 203, 204, and 205, a pressure control unit 238 that controls pressures within the processing chambers 201, 202, 203, 204, and 205, the transfer chamber 210, the loading chamber 208, the unloading chamber 209, and the cooling chambers 206 and 207, and the like. Referring to FIG. 13, the cluster device 200 further includes a controller 220. The controller 220 will be described later.

In the cluster device 200, for example, the silicon substrate 10 is processed in the following manner.

The gate valve 208b is opened, and a wafer 10 used as the silicon substrate 10 is loaded into the loading chamber (load lock chamber) 208 used as a loading spare chamber. After the loading, the gate valve 208b is closed, and the loading chamber 208 is vacuum-exhausted. When the inside of the loading chamber 208 reaches a predetermined pressure, the gate valve 208a is opened. Meanwhile, the inside of the transfer chamber 210 is vacuum-exhausted in advance, and is maintained to a predetermined pressure.

When the gate valve 208a is opened, the wafer 10 is picked up by the wafer transfer mechanism 211, and is extracted from the inside of the loading chamber 208 into the transfer chamber 210. Thereafter, the gate valve 208a is closed. When the gate valve 208a is closed, the gate valve 201a is opened, and the wafer 10 is loaded from the inside of the transfer chamber 210 into the first processing chamber 201 by the wafer transfer mechanism 211. After the loading, the gate valve 201 a is closed, a step of forming the $SiO_2$ film on the wafer 10 is performed within the processing chamber 201 (step S102).

Thereafter, the gate valve 201a is opened, and the wafer 10 after the $SiO_2$ film is formed is picked up by the wafer transfer mechanism 211 and is extracted from the inside of the processing chamber 201 into the transfer chamber 210. Thereafter, the gate valve 201a is closed. When the gate valve 201a is closed, the gate valve 202a is opened, and the wafer 10 after the $SiO_2$ film is formed is loaded from the inside of the transfer chamber 210 into the processing chamber 202 by the wafer transfer mechanism 211. After the loading, the gate valve 202a is closed, a step of forming the $HfO_2$ film on the $SiO_2$ film located on the wafer 10 is performed within the processing chamber 202 (step S103).

Thereafter, the gate valve 202a is opened, and the wafer 10 after the $HfO_2$ film is formed is picked up by the wafer transfer mechanism 211 and is extracted from the inside of the processing chamber 202 into the transfer chamber 210. Thereafter, the gate valve 202a is closed. When the gate valve 202a is closed, the gate valve 203a is opened, and the wafer 10 after the $HfO_2$ film is formed is loaded from the inside of the transfer chamber 210 into the processing chamber 203 by the wafer transfer mechanism 211. After the loading, the gate valve 203a is closed, a PDA step is performed on the $HfO_2$ film located on the wafer 10 within the processing chamber 203 (step S104).

Thereafter, the gate valve 203a is opened, and the wafer 10 after the PDA is picked up by the wafer transfer mechanism 211 and is extracted from the inside of the processing chamber 203 into the transfer chamber 210. Thereafter, the gate valve 203a is closed. When the gate valve 203a is closed, the gate valve 204a is opened, and the wafer 10 after the PDA is loaded from the inside of the transfer chamber 210 into the processing chamber 204 by the wafer transfer mechanism 211. After the loading, the gate valve 204a is closed, and a step of forming the TiN film on the $HfO_2$ film located on the wafer 10 after the PDA and a step of forming the TiAlN film thereon are continuously performed in-situ within the processing chamber 204 (steps S105 and S106). At this time, the TiN film and the TiAlN film may be laminated and formed as shown in FIG. 1, and may be laminated and formed as shown in FIG. 3.

Thereafter, the gate valve 204a is opened, and the wafer 10 after the formation of the TiN film and the TiAlN film is picked up by the wafer transfer mechanism 211 and is extracted from the inside of the processing chamber 204 into the transfer chamber 210. Thereafter, the gate valve 204a is closed. When the gate valve 204a is closed, the gate valve 205a is opened, and the wafer 10 after the formation of the TiN film and the TiAlN film is loaded from the inside of the transfer chamber 210 into the processing chamber 205 by the wafer transfer mechanism 211. After the loading, the gate valve 205a is closed, and a step of forming the poly-Si film on the TiAlN film (see FIG. 1) or the TiN film (see FIG. 3) located on the wafer 10 is performed within the processing chamber 205 (step S107).

Thereafter, the gate valve 205a is opened, and the wafer 10 after the formation of the poly-Si film is picked up by the wafer transfer mechanism 211 and is extracted from the inside of the processing chamber 205 into the transfer chamber 210. Thereafter, the gate valve 205a is closed. When the gate valve 205a is closed, the gate valve 209a is opened, and the wafer 10 in which a series of steps S102 to S107 are completed is transferred from the inside of the transfer chamber 210 into the unloading chamber (load lock chamber) 209 used as an unloading spare chamber by the wafer transfer mechanism 211. After the transfer, the gate valve 209a is closed. After the inside of the unloading chamber 209 is restored to atmospheric pressure, the gate valve 209b is opened, and the wafer 10 after a series of steps is extracted.

Meanwhile, the wafer 10 after each of the steps is carried out may be transferred into the cooling chamber 206 and the cooling chamber 207 as necessary, and may be cooled. In that case, the wafer 10 is stood by in the cooling chamber 206 or the cooling chamber 207 until it reaches a predetermined temperature. After the wafer is cooled until a predetermined temperature, the wafer is transferred into the processing chamber for performing the next step, or is unloaded through the unloading chamber 209.

Next, another example of the cluster device in which all of the steps S102 to S107 are continuously performed will be described with reference to FIG. 14. The cluster device 200 shown in FIG. 12 includes five processing chambers 201, 202, 203, 204, and 205, but a cluster device 300 shown in FIG. 14 includes six processing chambers 201, 202, 203, 204, 254, and 205, which is a point where the cluster device 300 is different from the cluster device 200 shown in FIG. 12, but other points are the same as each other.

Figure 14:
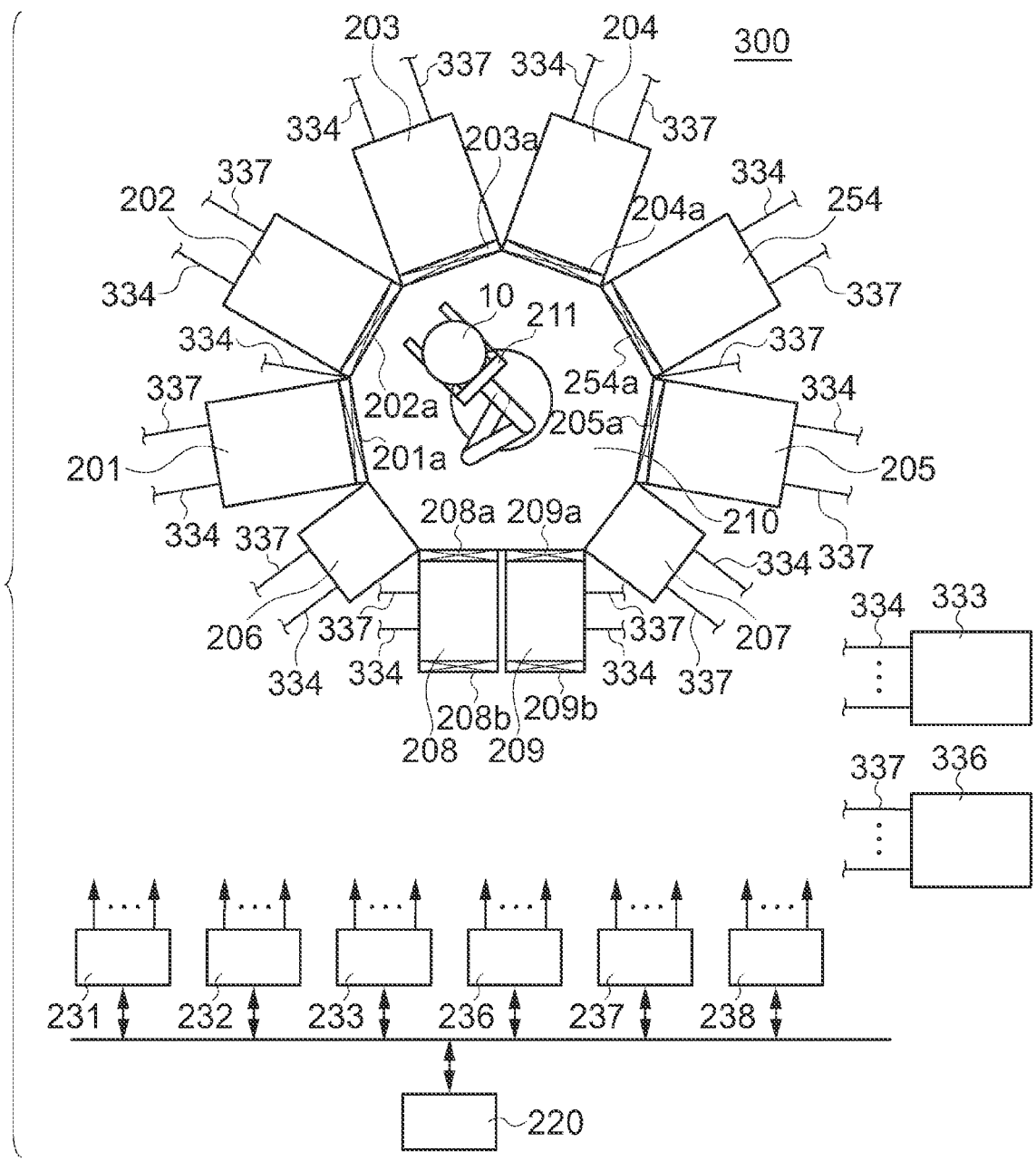
FIG. 14 is a schematic diagram for explaining another example of the cluster apparatus suitably used when a MOSFET according to a preferred embodiment of the present invention is manufactured.

In the cluster device 300 shown in FIG. 14, a gate valve 254a is provided between the transfer chamber 210 and the processing chamber 254. A processing gas or an inert gas is supplied from the gas supply system 333 through the gas piping 334 within the processing chamber 254. The processing chamber 254 is exhausted through the exhaust pipe 337 by the exhaust system 336. The opening and closing operation of the gate valve 254a is controlled by the gate valve control unit 231, the temperature within the processing chamber 254 is controlled by the temperature control unit 237. The pressure within the processing chamber 254 is controlled by the pressure control unit 238.

In the cluster device 200 shown in FIG. 12, a step of forming the TiN film on the $HfO_2$ film located on the wafer 10 after the PDA and a step of forming the TiAlN film thereon are continuously performed within the processing chamber 204. However, in the cluster device 300 shown in FIG. 14, a step of forming the TiN film is performed within the processing chamber 204, and a step of forming the TiAlN film is performed within the processing chamber 254.

Meanwhile, a series of processes mentioned above are performed by controlling the operation of each of the units constituting the cluster devices 200 and 300 using the controller 220.

Referring to FIG. 13, the controller 220 which is a control unit (control means) is configured as a computer including a CPU (Central Processing Unit) 121a, a RAM (Random Access Memory) 121b, a storage device 121c, and an I/O port 121d. The RAM 121b, the storage device 121c, and the I/O port 121d is configured to be capable of exchanging data with the CPU 121a through an internal bus 121e. An input/output device 122 configured as, for example, a touch panel or the like is connected to the controller 220.

The storage device 121c is composed of, for example, a flash memory, a HDD (Hard Disk Drive) or the like. A control program for controlling the operation of the cluster device 200, a process recipe in which the procedures or conditions of a series of wafer processing mentioned above are described, and the like are stored in the storage device 121c so as to be read out. Meanwhile, the process recipe functions as a program and is combined so as to cause the controller 220 to execute each of the procedures (each of the steps) in the series of wafer processing mentioned above to obtain predetermined results. Hereinafter, the process recipe, the control program and the like are collectively called a program simply. Meanwhile, when the term "program" is used in the specification, there is a case where only the process recipe alone is included, a case where only the control program alone is included, or a case where both of them are included. In addition, the RAM 121b is configured as a memory area (work area) in which a program, data or the like read out by the CPU 121a is temporarily held.

The I/O port 121d is connected, through a bus 240, to the gate valve control unit 231, the transfer mechanism control unit 232, the gas supply system control unit 233, the exhaust system control unit 236, the temperature control unit 237, the pressure control unit 238, and the like which are mentioned above.

The CPU 121a is configured to read out a control program from the storage device 121c and execute the read out control program, and to read out a process recipe from the storage device 121c in accordance with an input or the like of an operation command from the input/output device 122. The CPU 121a is configured to control the gate valve control unit 231, the transfer mechanism control unit 232, the gas supply system control unit 233, the exhaust system control unit 236, the temperature control unit 237, the pressure control unit 238 and the like so as to be follow the contents of the read out process recipe, and to control operations of a heater (not shown) and the like for heating the gate valves 201a, 202a, 203a, 204a, 254a, 205a, 208a, 209a, 208b, and 209b, the transfer mechanism 211, the gas supply system 333, the exhaust system 336, and the processing chambers 201, 202, 203, 204, 254, and 205.

Meanwhile, the controller 220 is not limited to a case where it is configured as a special-purpose computer, but may be configured as a general-purpose computer. For example, an external storage device 123 having the above-mentioned program stored therein (for example, magnetic tapes, magnetic disks such as a flexible disk and a hard disk, optical disks such as a CD and a DVD, magneto-optical disks such as a MO, and semiconductor memories such as a USB memory and a memory card) is prepared, and the controller 220 according to the embodiment can be configured by installing a program to a general-purpose computer using such an external storage device 123. Meanwhile, means for supplying a program to a computer is not limited to a case where the program is supplied through an external storage device 123. For example, the program may be supplied without being through the external storage device 123, using communication means such as the Internet and the dedicated line. Meanwhile, the storage device 121c and the external storage device 123 are configured as a computer readable recording medium. Hereinafter, these devices are collectively called a recording medium simply. Meanwhile, when the term "recording medium" is used in the specification, there is a case where only the storage device 121c alone is included, a case where only the external storage device 123 alone is included, or a case where both of them are included.

Meanwhile, as a substrate processing system, stand-alone type devices which independently perform a process in each of the steps are respectively prepared instead of the cluster device, and a series of processes thereof may be performed. In addition, each of the embodiments, each of the application examples and the like can be used as an appropriate combination thereof.

In addition, the present invention can also be realized, for example, by changing a process recipe of an existing substrate processing system. When the process recipe is changed, the process recipe according to the present invention is installed to the existing substrate processing system through the electric telecommunication line or a recording medium having the corresponding process recipe recorded thereon, or an input/output device of the existing substrate processing system is operated, and thus the process recipe itself can also be changed to the process recipe according to the present invention.

EXAMPLE 1

An evaluation sample for a MOSFET according to a preferred embodiment of the present invention and an evaluation sample according to a comparative example are created, and the characteristics such as the electrical characteristics thereof are compared with each other.

Figure 4:
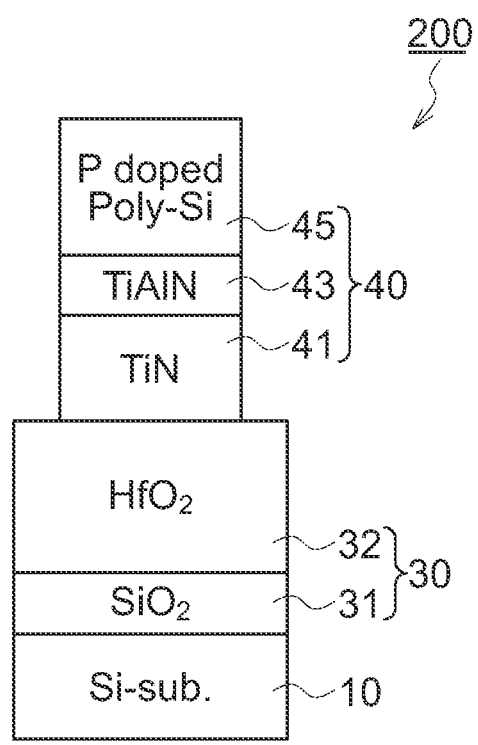
FIG. 4 is a schematic longitudinal cross-sectional view for explaining an evaluation sample for a MOSFET according to a preferred embodiment of the present invention.

First, an evaluation sample of a MOSFET 200 according to the preferred embodiment of the present invention will be described with reference to FIG. 4. In the MOSFET 100 of FIG. 1 according to the preferred embodiment of the present invention, the source region 21 and the drain region 22 exist, but in the evaluation sample 200, the source region 21 and the drain region 22 do not exist, which is a point which is different from that of the MOSFET 100 of the preferred embodiment, but other points are the same as each other, and thus the description thereof will be omitted. In addition, a manufacturing method is the same as the manufacturing method described with reference to FIG. 2, and thus the description thereof will be omitted. However, in the manufacturing of the evaluation sample 200, after the FGA step (step S113), Al deposition is performed on the backside of the silicon substrate 10 for the purpose of anti-oxidation or the like.

Figure 5:
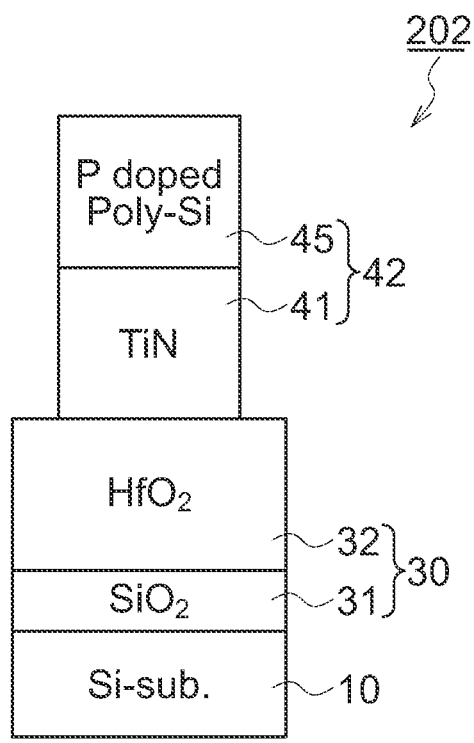
FIG. 5 is a schematic longitudinal cross-sectional view for explaining an evaluation sample for a MOSFET according to a comparative example.
Figure 6:
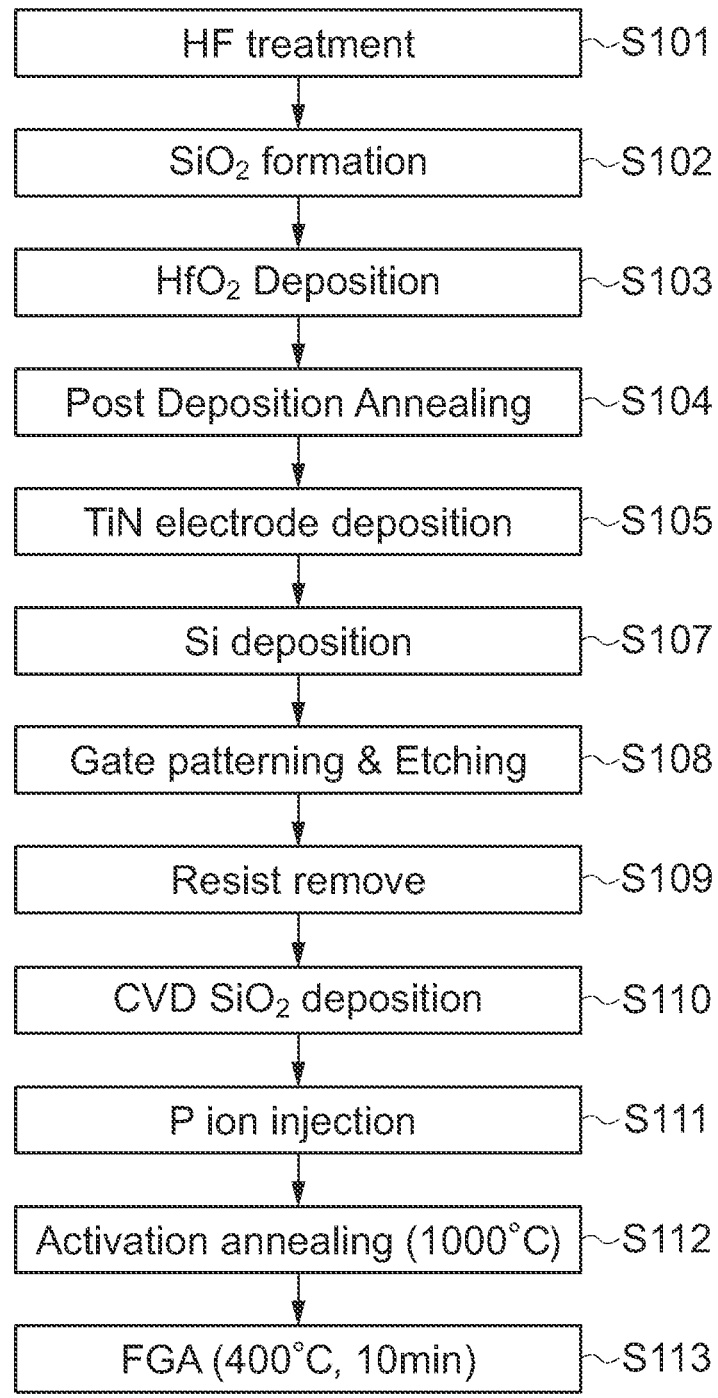
FIG. 6 is a flowchart for explaining a method of manufacturing an evaluation sample for a MOSFET according to a comparative example.

Next, an evaluation sample 202 according to a comparative example will be described with reference to FIG. 5. In the evaluation sample of a MOSFET of FIG. 4 according to the preferred embodiment of the present invention, the TiAlN film 43 exists. However, in the evaluation sample 202 according to the comparative example, the TiAlN film 43 does not exist, and a gate electrode 42 composed of the polycrystalline silicon film 45 and the TiN film 41 is included, which is a point which is different from that of the evaluation sample of the MOSFET according the preferred embodiment. Other points are the same as each other, and thus the description thereof will be omitted. In addition, the method of manufacturing the evaluation sample 202 does not have the step S106 of depositing the TiAlN film 43 in the method of manufacturing the evaluation sample 200. All the rest are the same, and thus the description thereof will be omitted (see FIG. 6).

Figure 7:
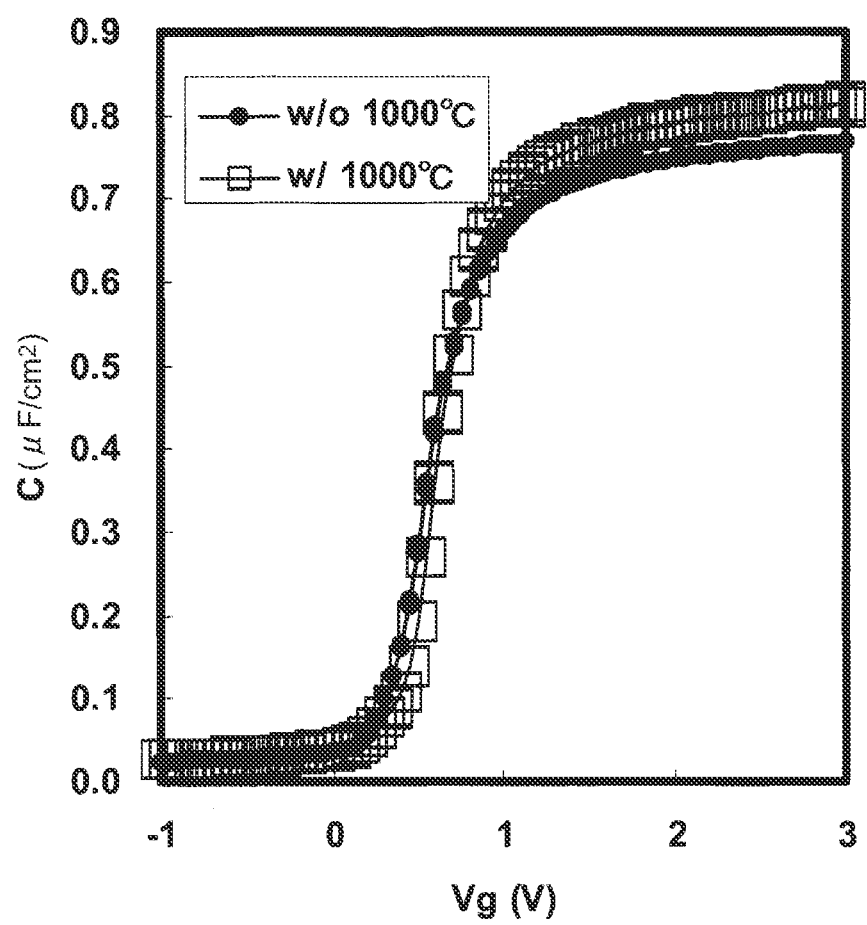
FIG. 7 is a diagram of the C-V characteristics of the evaluation sample for a MOSFET according to a preferred embodiment of the present invention.
Figure 8:
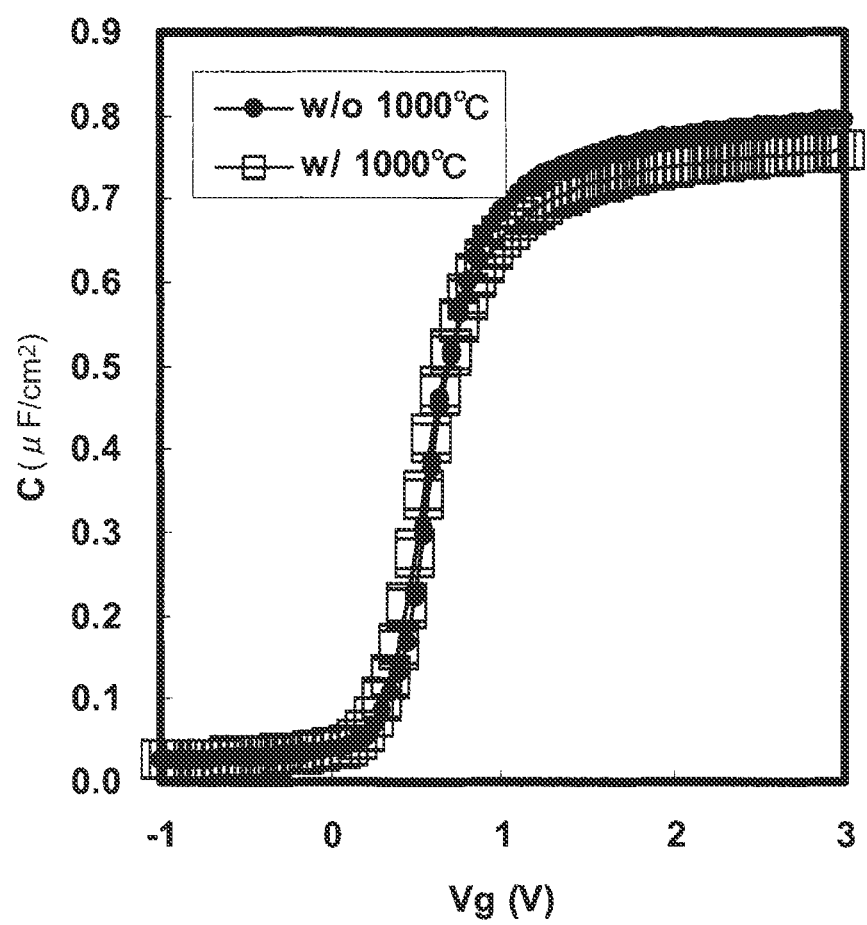
FIG. 8 is a diagram of the C-V characteristics of the evaluation sample for a MOSFET according to the comparative example.

FIG. 7 is a diagram illustrating the C-V characteristics of the evaluation sample for the MOSFET 200 according to the preferred embodiment of the present invention, and FIG. 8 is a diagram illustrating the C-V characteristics of the evaluation sample 202 according to the comparative example. The horizontal axes of FIGS. 7 and 8 indicate gate voltage Vg (V) applied to the gate electrode at the time of the measurement of the C-V characteristics, and the vertical axes indicate capacitance C (g/cm²). The ● marks in FIGS. 7 and 8 indicate a case where an activation annealing process at 1,000° C. is not performed (hereinafter, called "treatment at 1,000° C. is done"), and the ☐ marks indicate a case where an activation annealing process at 1,000° C. is performed (hereinafter, called "treatment at 1,000° C. is not done"). FIG. 9 is a table indicating EOT (effective oxide thickness) and Vfb (flat band voltage) extracted from each of the C-V curves shown in FIGS. 7 and 8.

From FIGS. 7, 8, and 9, in the comparative example, it is understood that compared to a case where treatment at 1,000° C. is not done, the EOT increases in a case where treatment at 1,000° C. is done, and Vfb shifts in the negative direction. This is considered that Si in the polycrystalline silicon film 45 is diffused into the TiN film 41 and reaches the interface between the TiN film 41 and the HfO₂ film 32, whereby a Si—O bond occurs in the interface, and as a result, the EOT increases. In addition, it is considered that Si in the polycrystalline silicon film 45 reaches the interface between the TiN film 41 and the HfO₂ film 32, whereby the Fermi-level pinning phenomenon occurs, and as a result, a work function lowers and thus Vfb shifts in the negative direction. Meanwhile, when Vfb shifts in the negative direction, the threshold voltage increases. On the other hand, in the structure according to the preferred embodiment of the present invention, it is understood that compared to a case where treatment at 1,000° C. is not done, the EOT decreases in a case where treatment at 1,000° C. is done, and Vfb shifts in the positive direction. When Vfb shifts in the positive direction, the threshold voltage decreases. The reduction in the EOT is considered to be due to the densification of the HfO₂ film 32 based on treatment at 1,000° C. In this manner, the TiAlN film 43 is provided on the TiN film 41, and thus it is possible to prevent or suppress the Si diffusion from the polycrystalline silicon film 45, and to thereby prevent or suppress Si in the polycrystalline silicon film 45 from reaching the interface between the TiN film 41 and the HfO₂ film 32. Thereby, it is possible to prevent or suppress a rise in the threshold voltage, and to prevent or suppress lowering in Vfb.

Figure 10:
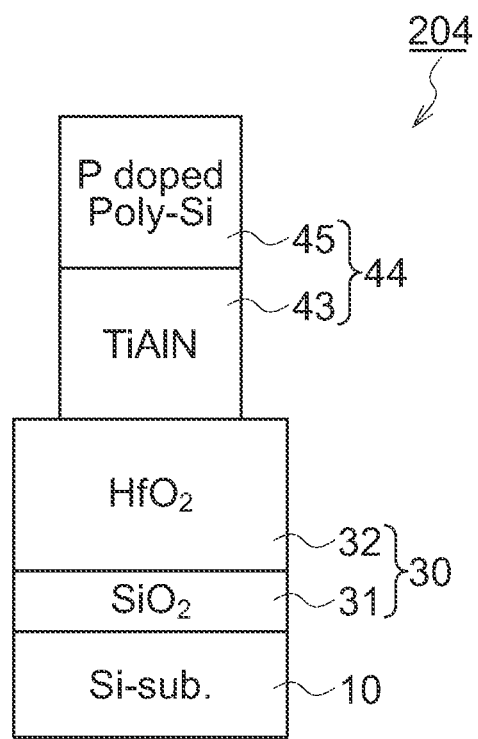
FIG. 10 is a schematic longitudinal cross-sectional view for explaining an evaluation sample for a MOSFET according to another comparative example.

Next, an evaluation sample 204 according to another comparative example will be described with reference to FIG. 10. In the evaluation sample 204 according to the comparative example, the TiAlN film 43 is provided on the HfO₂ film 32 without providing the TiN film 41, and the polycrystalline silicon film 45 is provided on the TiAlN film 43. In this case, the diffusion of Si from the polycrystalline silicon film 45 is prevented by the TiAlN film 43. However, Al in the TiAlN film 43 is diffused into the HfO₂ film 32 and thus the EOT increases. In addition, since the work function of TiAlN is smaller than that of TiN, the gate leakage current increases. On the other hand, in the evaluation sample of the MOSFET 200 according to the preferred embodiment of the present invention described with reference to FIG. 4, it is not only possible to prevent the diffusion of Si from the polycrystalline silicon film 45 by providing the TiAlN film 43, but also to prevent or suppress the diffusion of Al in the TiAlN film 43 into the HfO₂ film 32 by providing the TiN film 41 between the TiAlN film 43 and the HfO₂ film 32. As a result, it is possible to prevent or suppress an increase in the EOT. Further, since the TiN film 41 exists on the HfO₂ film 32 which is a gate insulating film and the work function of TiN is larger than that of TiAlN, the gate leakage current decreases.

(Preferred Aspects of the Present Invention)
Hereinafter, preferred aspects of the present invention will be described.

(Additional Remark 1)
According to one preferable aspect of the present invention, there is provided
a semiconductor device, comprising:
a gate insulating film formed on a semiconductor substrate;
a first conductive metal-containing film formed on the gate insulating film;
a second conductive metal-containing film, formed on the first metal-containing film, to which aluminum is added; and
a silicon film formed on the second metal-containing film.

(Additional Remark 2)
In the semiconductor device according to Additional Remark 1, preferably, the second metal-containing film is a conductive metal-containing film constituted of the same material as the first metal-containing film to which aluminum is added.

(Additional Remark 3)
In the semiconductor device according to Additional Remark 1 or 2, preferably, the gate insulating film includes a high dielectric constant insulating film.

(Additional Remark 4)
In the semiconductor device according to Additional Remark 1 or 2, preferably, the gate insulating film includes a silicon-based insulating film, and a high dielectric constant insulating film formed on the silicon-based insulating film.

(Additional Remark 5)
In the semiconductor device according to any one of Additional Remarks 1 to 4, preferably, the second metal-containing film includes a TiAlN film.

(Additional Remark 6)
In the semiconductor device according to any one of Additional Remarks 1 to 4, preferably, the first metal-containing film includes a TiN film, and the second metal-containing film includes a TiAlN film.

(Additional Remark 7)
According to another preferable aspect of the present invention, there is provided
a method of manufacturing a semiconductor device, comprising:
forming a gate insulating film on a semiconductor substrate;
forming a first conductive metal-containing film on the gate insulating film;
forming a second conductive metal-containing film to which aluminum is added onto the first metal-containing film; and
forming a silicon film on the second metal-containing film.

(Additional Remark 8)
In the method of manufacturing a semiconductor device according to Additional Remark 7, preferably, the second metal-containing film is a conductive metal-containing film constituted of the same material as the first metal-containing film to which aluminum is added.

(Additional Remark 9)
In the method of manufacturing a semiconductor device according to Additional Remark 7 or 8, preferably, the gate insulating film includes a high dielectric constant insulating film.

(Additional Remark 10)
In the method of manufacturing a semiconductor device according to Additional Remark 7 or 8, preferably, the gate insulating film includes a silicon-based insulating film, and a high dielectric constant insulating film formed on the silicon-based insulating film.

(Additional Remark 11)

In the method of manufacturing a semiconductor device according to any one of Additional Remarks 7 to 10, preferably, the second metal-containing film includes a TiAlN film.

(Additional Remark 12)

In the method of manufacturing a semiconductor device according to any one of Additional Remarks 7 to 10, preferably, the first metal-containing film includes a TiN film, and the second metal-containing film includes a TiAlN film.

(Additional Remark 13)

The method of manufacturing a semiconductor device according to any one of Additional Remarks 7 to 12, preferably, further comprises performing activation annealing after the forming of the silicon film.

(Additional Remark 14)

According to still another preferable aspect of the present invention, there is provided a semiconductor device, comprising:

a gate insulating film formed on a semiconductor substrate;

a conductive metal-containing film formed on the gate insulating film; and a silicon film formed on the metal-containing film, wherein a diffusion barrier film that prevents silicon from being diffused from the silicon film into the metal-containing film is provided between the metal-containing film and the silicon film.

(Additional Remark 15)

According to still another preferable aspect of the present invention, there is provided a semiconductor device, comprising:

a gate insulating film formed on a semiconductor substrate;

a conductive metal-containing film formed on the gate insulating film; and a silicon film formed on the metal-containing film, wherein a diffusion barrier film that prevents silicon from being diffused from the silicon film into an interface between the metal-containing film and the insulating film is provided in the metal-containing film.

(Additional Remark 16)

In the semiconductor device according to Additional Remark 14 or 15, preferably, the diffusion barrier film is provided so as to come into contact with the silicon film.

(Additional Remark 17)

In the semiconductor device according to Additional Remark 14 or 15, preferably, the diffusion barrier film is provided at an interface between the metal-containing film and the silicon film.

(Additional Remark 18)

In the semiconductor device according to any one of Additional Remarks 14 to 17, preferably, the gate insulating film includes a high dielectric constant insulating film.

(Additional Remark 19)

In the semiconductor device according to any one of Additional Remarks 14 to 17, preferably, the gate insulating film includes a silicon-based insulating film, and a high dielectric constant insulating film formed on the silicon-based insulating film.

(Additional Remark 20)

In the semiconductor device according to any one of Additional Remarks 14 to 19, preferably, the diffusion barrier film is a conductive metal-containing film constituted of the same material as the metal-containing film to which aluminum is added.

(Additional Remark 21)

In the semiconductor device according to Additional Remark 20, preferably, the diffusion barrier film includes a TiAlN film.

(Additional Remark 22)

In the semiconductor device according to Additional Remark 20, preferably, the metal-containing film includes a TiN film, and the diffusion barrier film includes a TiAlN film.

(Additional Remark 23)

According to still another preferable aspect of the present invention, there is provided a method of manufacturing a semiconductor device, comprising:

forming a gate insulating film on a semiconductor substrate;

forming a conductive metal-containing film on the gate insulating film; and forming a silicon film on the metal-containing film, wherein a diffusion barrier film that prevents silicon from being diffused from the silicon film into the metal-containing film is formed between the metal-containing film and the silicon film.

(Additional Remark 24)

According to still another preferable aspect of the present invention, there is provided a method of manufacturing a semiconductor device, comprising:

forming a gate insulating film on a semiconductor substrate;

forming a conductive metal-containing film on the gate insulating film; and forming a silicon film on the metal-containing film, wherein in the forming of the metal-containing film, a diffusion barrier film that prevents silicon from being diffused from the silicon film into an interface between the metal-containing film and the gate insulating film is formed in the metal-containing film.

(Additional Remark 25)

In the method of manufacturing a semiconductor device according to Additional Remark 23 or 24, preferably, the diffusion barrier film is provided so as to come into contact with the silicon film.

(Additional Remark 26)

In the method of manufacturing a semiconductor device according to Additional Remark 23 or 24, preferably, the diffusion barrier film is provided in an interface between the metal-containing film and the silicon film.

(Additional Remark 27)

In the method of manufacturing a semiconductor device according to any one of Additional Remarks 23 to 26, preferably, the gate insulating film includes a high dielectric constant insulating film.

(Additional Remark 28)

In the method of manufacturing a semiconductor device according to any one of Additional Remarks 23 to 26, preferably, the gate insulating film includes a silicon-based insulating film, and a high dielectric constant insulating film formed on the silicon-based insulating film.

(Additional Remark 29)

In the method of manufacturing a semiconductor device according to any one of Additional Remarks 23 to 28, preferably, the diffusion barrier film is a conductive metal-containing film constituted of the same material as thet metal-containing film to which aluminum is added.

(Additional Remark 30)

In the method of manufacturing a semiconductor device according to Additional Remarks 29, preferably, the diffusion barrier film includes a TiAlN film.

(Additional Remark 31)

In the method of manufacturing a semiconductor device according to any one of Additional Remarks 23 to 29, preferably, the metal-containing film includes a TiN film, and the diffusion barrier film includes a TiAlN film.

(Additional Remark 32)

The method of manufacturing a semiconductor device according to any one of Additional Remarks 23 to 31, preferably, further comprises performing activation annealing after the forming of the silicon film.

(Additional Remark 33)

According to still another preferable aspect of the present invention, there is provided a semiconductor device, comprising:

a gate insulating film formed on a semiconductor substrate;

a conductive film, formed on the gate insulating film, in which a depletion layer is not generated when a voltage is applied; and a silicon film formed on the conductive film, wherein a diffusion barrier film that prevents silicon from being diffused from the silicon film into the conductive film is provided between the conductive film and the silicon film.

(Additional Remark 34)

According to still another preferable aspect of the present invention, there is provided a semiconductor device, comprising:

a gate insulating film formed on a semiconductor substrate;

a conductive film, formed on the gate insulating film, in which a depletion layer is not generated when a voltage is applied; and a silicon film formed on the conductive film, wherein a diffusion barrier film that prevents silicon from being diffused from the silicon film into an interface between the conductive film and the insulating film is provided in the conductive film.

(Additional Remark 35)

According to still another preferable aspect of the present invention, there is provided a method of manufacturing a semiconductor device, comprising:

forming a gate insulating film on a semiconductor substrate;

forming a conductive film, on the gate insulating film, in which a depletion layer is not generated when a voltage is applied; and forming a silicon film on the conductive film, wherein a diffusion barrier film that prevents silicon from being diffused from the silicon film into the conductive film is formed between the conductive film and the silicon film.

(Additional Remark 36)

According to still another preferable aspect of the present invention, there is provided a method of manufacturing a semiconductor device, comprising:

forming a gate insulating film on a semiconductor substrate;

forming a conductive film, on the gate insulating film, in which a depletion layer is not generated when a voltage is applied; and forming a silicon film on the conductive film, wherein in the forming of the conductive film, a diffusion barrier film that prevents silicon from being diffused from the silicon film into an interface between the conductive film and the gate insulating film is formed in the conductive film.

(Additional Remark 37)

According to still another preferable aspect of the present invention, there is provided a semiconductor device, comprising:

a high dielectric constant insulating film formed on a substrate;

a TiN film formed on the high dielectric constant insulating film;

a TiAlN film formed on the TiN film; and a silicon film formed on the TiAlN film.

(Additional Remark 38)

According to still another preferable aspect of the present invention, there is provided a method of manufacturing a semiconductor device, comprising:

forming a high dielectric constant insulating film on a substrate;

forming a TiN film on the high dielectric constant insulating film;

forming a TiAlN film on the TiN film; and forming a silicon film on the TiAlN film.

(Additional Remark 39)

According to still another preferable aspect of the present invention, there is provided a system of processing a substrate, comprising:

a first processing unit that forms a gate insulating film on a semiconductor substrate;

a second processing unit that forms a first conductive metal-containing film on the gate insulating film;

a third processing unit that forms a second conductive metal-containing film to which aluminum is added, on the first metal-containing film; and a fourth processing unit that forms a silicon film on the second metal-containing film.

(Additional Remark 40)

In the substrate processing system according to Additional Remark 39, preferably, the second processing unit and the third processing unit are the same processing unit.

(Additional Remark 41)

According to still another preferable aspect of the present invention, there is provided a non-transitory computer-readable medium storing a program that causes a computer to perform a process including:

forming a gate insulating film on a semiconductor substrate using a first processing unit of a substrate processing system;

forming a first conductive metal-containing film on the gate insulating film using a second processing unit of the substrate processing system;

forming a second conductive metal-containing film to which aluminum is added, on the first metal-containing film, using a third processing unit of the substrate processing system; and forming a silicon film on the second metal-containing film using a fourth processing unit of the substrate processing system.

As stated above, although various typical embodiments of the present invention have been described, the present invention is not limited to these embodiments. Therefore, the invention is intended to be limited only by the appended claims.

What is claimed is:

1. A method of manufacturing a semiconductor device, comprising:

forming a gate insulating film on a semiconductor substrate;

forming a first conductive metal-containing film directly on the gate insulating film;

forming a second conductive metal-containing film, to which aluminum is added, on the first metal-containing film; and forming a silicon film directly on the second metal-containing film.

2. The method according to claim 1, wherein the second metal-containing film is a conductive metal-containing film in which aluminum is added to the first metal-containing film.

3. The method according to claim 1, wherein the gate insulating film includes a high dielectric constant insulating film.

4. The method according to claim 1, wherein the gate insulating film includes a silicon-based insulating film, and a high dielectric constant insulating film formed on the silicon-based insulating film.

5. The method according to claim 1, wherein the second metal-containing film includes a TiAlN film.

6. The method according to claim 1, wherein the first metal-containing film includes a TiN film, and the second metal-containing film includes a TiAlN film.

7. The method according to claim 1, further comprising performing activation annealing after the forming of the silicon film.

8. The method according to claim 1, wherein a thickness of the second conductive metal-containing film is from 3 to 20 nm.

9. The method according to claim 1, wherein a thickness of the second conductive metal-containing film is from 3 to 10 nm.

10. The method according to claim 1, wherein a thickness of the second conductive metal-containing film is from 5 to 20 nm.

11. The method according to claim 1, wherein a thickness of the second conductive metal-containing film is from 5 to 10 nm.

12. The method according to claim 1, wherein a concentration of aluminum contained in the second conductive metal-containing film is from 10 to 20%.

13. The method according to claim 1, wherein the second conductive metal-containing film is separated from the gate insulating film by a distance of 2nm or more.

14. The method according to claim 1, wherein the second conductive metal-containing film serves as a diffusion barrier film that prevents silicon from being diffused from the silicon film into an interface between the first metal-containing film and the gate insulating film.

15. The method according to claim 4, wherein the second conductive metal-containing film serves as a diffusion barrier film that prevents silicon from being diffused from the silicon film into an interface between the first metal-containing film and the high dielectric constant insulating film.

16. A method of manufacturing a semiconductor device, comprising:
    forming a gate insulating film on a semiconductor substrate;
    forming a conductive metal-containing film directly on the gate insulating film; and
    forming a silicon film directly on the metal-containing film,
    wherein in the forming of the metal-containing film, a diffusion barrier film that prevents silicon from being diffused from the silicon film into an interface between the metal-containing film and the gate insulating film is formed in the metal-containing film.

17. A method of manufacturing a semiconductor device, comprising:
    forming a gate insulating film on a semiconductor substrate;
    forming a first conductive metal-containing film directly on the gate insulating film;
    forming a second conductive metal-containing film to which aluminum is added,. directly on the first metal-containing film;
    forming a third conductive metal-containing film directly on the second conductive metal-containing film; and
    forming a silicon film directly on the third metal-containing film.

18. The method according to claim 17, wherein the second conductive metal-containing film is separated from the gate insulating film by a distance of 2nm or more.

19. The method according to claim 17, wherein the first conductive metal-containing film and the third conductive metal-containing film are formed from a same material.

20. The method according to claim 17, wherein the first conductive metal-containing film and the third conductive metal-containing film include TiN films, and the second conductive metal-containing film includes a TiAlN film.

* * * * *